US011845870B2

(12) United States Patent
Mitkova et al.

(10) Patent No.: US 11,845,870 B2
(45) Date of Patent: Dec. 19, 2023

(54) THIN FILMS PRINTED WITH CHALCOGENIDE GLASS INKS

(71) Applicant: BOISE STATE UNIVERSITY, Boise, ID (US)

(72) Inventors: Maria Mitkova, Boise, ID (US); Al-Amin Ahmed Simon, Boise, ID (US); Shah Mohammad Rahmot Ullah, Milpitas, CA (US); Bahareh Badamchi, Boise, ID (US); Harish Subbaraman, Boise, ID (US)

(73) Assignee: Boise State University, Boise, ID (US)

( * ) Notice: Subject to any disclaimer, the term of this patent is extended or adjusted under 35 U.S.C. 154(b) by 330 days.

(21) Appl. No.: 17/111,353

(22) Filed: Dec. 3, 2020

(65) Prior Publication Data

US 2021/0163770 A1 Jun. 3, 2021

Related U.S. Application Data

(60) Provisional application No. 62/943,044, filed on Dec. 3, 2019, provisional application No. 62/943,031, filed on Dec. 3, 2019.

(51) Int. Cl.
*G11C 13/00* (2006.01)
*C09D 11/03* (2014.01)
(Continued)

(52) U.S. Cl.
CPC .............. *C09D 11/03* (2013.01); *B33Y 10/00* (2014.12); *B33Y 40/10* (2020.01); *B33Y 70/10* (2020.01);
(Continued)

(58) Field of Classification Search
CPC ....... C09D 11/03; C09D 11/38; C09D 11/322; C09D 11/36; B33Y 10/00; B33Y 40/10; B33Y 70/10; B33Y 30/00; C03B 5/2252; C03B 19/12; C03C 1/006; C03C 3/321; C03C 21/005; C03C 2203/50; C03C 2204/00; C03C 8/16; G11C 13/0011;
(Continued)

(56) References Cited

U.S. PATENT DOCUMENTS 3,781,748 A * 12/1973 Bishop ..................... G01J 5/20
374/129
5,366,936 A * 11/1994 Vlosov .................. G01N 27/36
501/40

OTHER PUBLICATIONS

Ramachandran et al., "Photoinduced integrated-optic devices in rapid thermally annealed chalcogenide glasses," IEEE Journal of Selected Topics in Quantum Electronics, vol. 11, No. 11, pp. 260-270. (Year: 2005).*

* cited by examiner

*Primary Examiner* — Kiho Kim
(74) *Attorney, Agent, or Firm* — PARSONS BEHLE & LATIMER

(57) ABSTRACT

A device formation method may include printing a chalcogenide glass ink onto a surface to form a chalcogenide glass layer, where the chalcogenide glass ink comprises chalcogenide glass and a fluid medium. The method may further include sintering the chalcogenide glass layer at a first temperature for a first duration. The method may also include annealing the chalcogenide glass layer at a second temperature for a second duration. A device may include a substrate and a printed chalcogenide glass layer on the substrate, where the printed chalcogenide glass layer includes annealed chalcogenide glass, and where the printed chalcogenide glass layer is free from cracks.

13 Claims, 5 Drawing Sheets

(51) Int. Cl.
*B33Y 70/10* (2020.01)
*C03C 3/32* (2006.01)
*C03C 1/00* (2006.01)
*C03B 19/12* (2006.01)
*C03B 5/225* (2006.01)
*B33Y 40/10* (2020.01)
*B33Y 10/00* (2015.01)
*C03C 21/00* (2006.01)
*C09D 11/38* (2014.01)
*B33Y 30/00* (2015.01)
*B82Y 30/00* (2011.01)
*B82Y 40/00* (2011.01)

(52) U.S. Cl.
CPC ............ *C03B 5/2252* (2013.01); *C03B 19/12* (2013.01); *C03C 1/006* (2013.01); *C03C 3/321* (2013.01); *C03C 21/005* (2013.01); *C09D 11/38* (2013.01); *G11C 13/0011* (2013.01); *B33Y 30/00* (2014.12); *B82Y 30/00* (2013.01); *B82Y 40/00* (2013.01); *C03C 2203/50* (2013.01); *C03C 2204/00* (2013.01); *G11C 2213/30* (2013.01)

(58) Field of Classification Search
CPC . G11C 2213/30; G11C 13/0004; B82Y 30/00; B82Y 40/00
See application file for complete search history.

THIN FILMS PRINTED WITH CHALCOGENIDE GLASS INKS

CROSS-REFERENCE TO RELATED APPLICATIONS

This application claims priority to, and the benefit of, U.S. Provisional Patent Application No. 62/943,031, filed on Dec. 3, 2019, and entitled "Materials Characterization of Thin Films Printed with Ge20Se80 Ink," and U.S. Provisional Patent Application No. 62/943,044, filed on Dec. 3, 2019, and entitled "Studies and Analysis of GexSe100-x Based Spin Coated Chalcogenide Thin Films," the contents of each of which are incorporated by reference herein in their entirety.

GOVERNMENT LICENSE RIGHTS

This invention was made with Government support under contract number DE-NE0008691, 17-12633 awarded by the Department of Energy. The Government has certain rights in the invention.

FIELD OF THE DISCLOSURE

This disclosure is generally related to the field of additive printing of thin films and, in particular, to thin films printed with chalcogenide glass ink.

BACKGROUND

Radiation hard temperature sensors are desirable for many applications. These sensors are particularly useful in hostile environments where heat, radiation, or a combination of both, may prevent human contact with a sample to be measured. Particular applications for these sensors may include space exploration, high temperature manufacturing processes, and others. Chalcogenide glasses may be resistant to radiation and some chalcogenide glasses may be stable at relatively high temperatures. They may also include crystalline, electrical, and optical properties that can be helpful for radiation and temperature measurements.

Typical chalcogenide glass film formation may be performed using vapor deposition processes. These processes may rely on expensive and specialized equipment to perform and may require the application of a photolithography process. Further, vapor deposition processes may be too costly to justify in some applications. These processes are also time-intensive and may make mass production of chalcogenide glass sensors unfeasible.

Additive manufacturing or printing may have many advantages over traditional manufacturing processes, such as lower costs, higher throughput, and high conformity. However, chalcogenide glass may be subject to cracking and potential property changes when typical printing methods are applied. Further, a surface of a printed chalcogenide glass layer may be too rough for some applications. Other disadvantages may exist.

SUMMARY

Described herein is a method for printing a chalcogenide glass layer without cracking the chalcogenide glass layer and without changing a transmission spectrum of the chalcogenide glass layer relative to bulk chalcogenide glass material.

In an embodiment, a device formation method includes printing a chalcogenide glass ink onto a surface to form a chalcogenide glass layer, where the chalcogenide glass ink comprises chalcogenide glass and a fluid medium. The method further includes sintering the chalcogenide glass layer at a first temperature for a first duration. The method also includes annealing the chalcogenide glass layer at a second temperature for a second duration.

In some embodiments, the chalcogenide glass is in the form of nanoparticles suspended in the fluid medium. In some embodiments, the chalcogenide glass nanoparticles have a diameter that is less than or equal to 100 nm. In some embodiments, the fluid medium is an amine, and wherein the chalcogenide glass is dissolved in the amine. In some embodiments, the first temperature is 80° C., the first duration is less than or equal to 2 days, the second temperature is 300° C., and the second duration is at least 15 minutes. In some embodiments, the chalcogenide glass layer is free from cracks after the annealing. In some embodiments, a transmission spectrum of the chalcogenide glass layer is unchanged by the annealing and an annealing temperature is below a glass transition temperature of the chalcogenide glass. In some embodiments, printing the chalcogenide glass layer comprises using an inkjet printing process, an aerosol jet printing method, or a dip-coating process. In some embodiments, the chalcogenide glass includes a germanium-20-selenium-80 (Ge20Se80) glass system or a germanium-20-selenium-80 (Ge20S80) glass system. In some embodiments, the fluid medium includes an amine, such as butylamine. In other embodiments, the fluid medium is free from amines. In some embodiments, the fluid medium includes cyclohexanone. In some embodiments, the chalcogenide glass ink includes 0.8 grams of chalcogenide glass per 10 milliliters of the fluid medium.

In some embodiments, the device is a radiation sensor, and the method includes positioning a silver layer on the chalcogenide glass layer and a nickel layer on the chalcogenide glass layer, where a presence of radiation causes at least a portion of the silver layer to diffuse into the chalcogenide glass layer, and where the silver layer diffusing into the chalcogenide glass layer changes an electrical resistance of the chalcogenide glass layer. In some embodiments, a negative electrical field applied to the silver layer causes the silver to return from the chalcogenide glass into the silver layer. In some embodiments, the device is a temperature sensor, and the method includes forming a first nickel electrode on a substrate, where the surface is a surface of the first nickel electrode, and forming a second nickel electrode on the chalcogenide glass layer, where a presence of heat above a threshold temperature causes the chalcogenide glass layer to crystalize, and where crystallization of the chalcogenide glass layer changes an electrical resistance of the chalcogenide glass layer. In some embodiments, the device is a temperature sensor, where the surface is a surface of an optical fiber, where a presence of heat above a threshold temperature causes the chalcogenide glass layer to begin to crystalize, and where an optical reflection parameter of chalcogenide glass layer changes as a function of an amount of crystallization within the chalcogenide glass layer.

In an embodiment, a device includes a substrate and a printed chalcogenide glass layer on the substrate, where the printed chalcogenide glass layer includes annealed chalcogenide glass, and wherein the printed chalcogenide glass layer is free from cracks.

In some embodiments, the device includes a silver layer positioned on the chalcogenide glass layer, where a presence of radiation causes at least a portion of the silver layer to diffuse into the chalcogenide glass layer, and where the silver layer diffusing into the chalcogenide glass layer changes an electrical resistance of the chalcogenide glass layer. In some embodiments, the device includes a first nickel electrode formed on the substrate and positioned between the substrate and the chalcogenide glass layer, and a second nickel electrode formed on the chalcogenide glass layer, where a presence of heat above a threshold temperature causes the chalcogenide glass layer to crystalize, and where crystallization of the chalcogenide glass layer changes an electrical resistance of the chalcogenide glass layer. In some embodiments, the substrate is a portion of an optical fiber, where a presence of heat above a threshold temperature causes the chalcogenide glass layer to begin to crystalize, and where an optical reflection parameter of chalcogenide glass layer changes as a function of an amount of crystallization within the chalcogenide glass layer. In some embodiment, the chalcogenide glass layer is transformed from a crystalized condition to an amorphous condition by application of a voltage to melt the chalcogenide glass layer by Joule heating followed by quenching as a result of the substrate being at room temperature.

Figure 1:
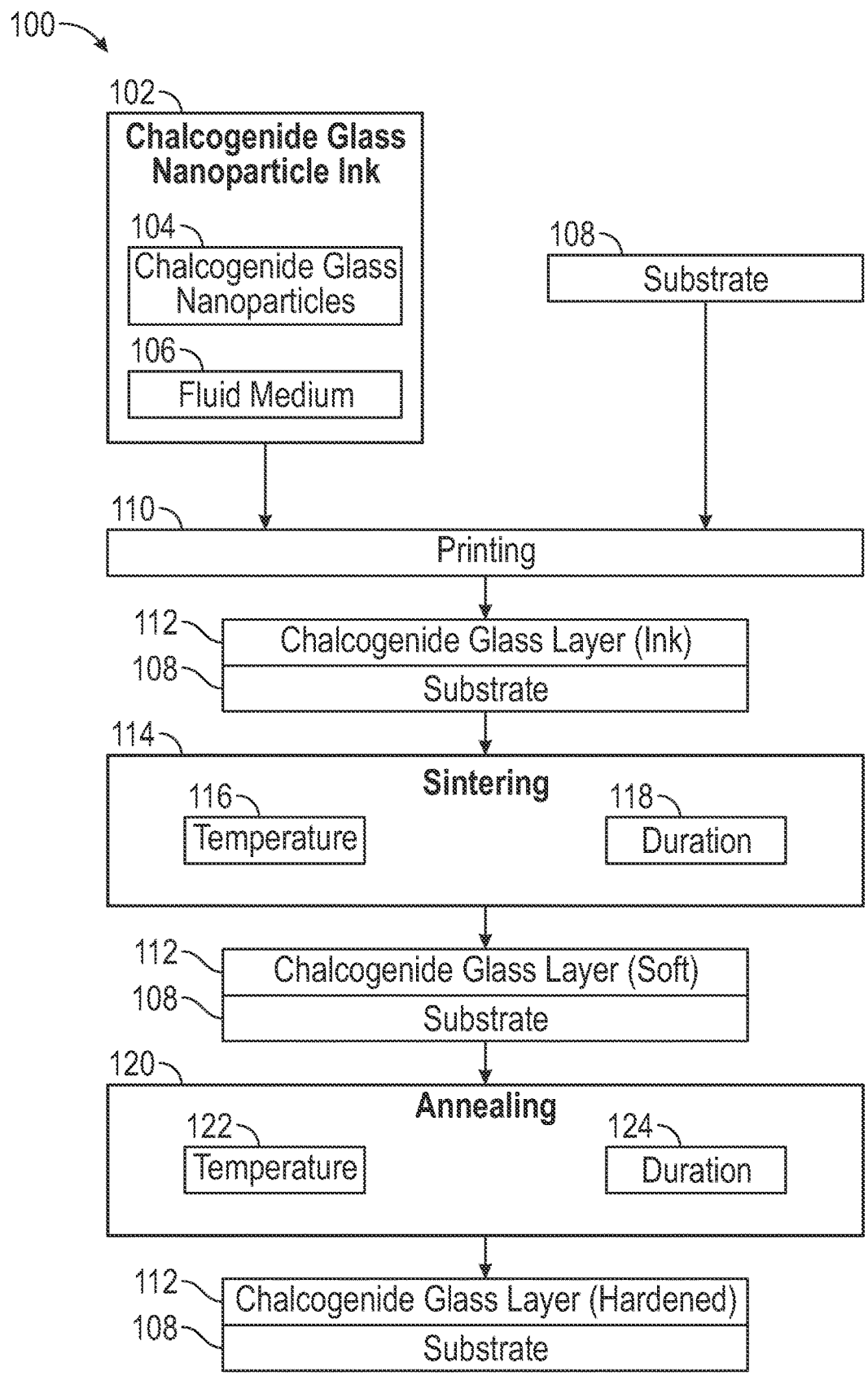
FIG. 1 is a flow diagram depicting an embodiment of a process for printing a chalcogenide glass layer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Referring to FIG. 1, an embodiment of a process 100 for printing a chalcogenide glass layer 112 is depicted. The process 100 may include applying a printing subprocess 110 to print a chalcogenide glass nanoparticle ink 102 onto a substrate 108. The chalcogenide glass nanoparticle ink 102 may include at least chalcogenide glass nanoparticles 104 and a fluid medium 106 mixed with the chalcogenide glass nanoparticles 104. Although not described in this disclosure, the chalcogenide glass nanoparticle ink 102 may include other additives as well.

Examples of chalcogenide glass material that may be included within the chalcogenide glass nanoparticles 104 may include Ge20Se70 or Ge20Se80. Other Ge—Se compositions may also be used. The chalcogenide glass nanoparticles 104 may be in the form of a fine powder, having a diameter of less than or equal to 100 nm. Further, in some embodiments, the fluid medium 106 may include butylamine. However, amines may result in the degradation of some printing components. Thus, in some cases, the fluid medium 106 may be free from amines. For example, the fluid medium 106 may include cyclohexanone. In an example, the chalcogenide glass nanoparticle ink includes 0.8 grams of chalcogenide glass nanoparticles per 10 milliliters of the fluid medium. Examples of chalcogenide glass nanoparticle inks that may be useable with this method are described in U.S. patent application Ser. No. 17/111,316, filed on Dec. 3, 2020, and entitled "Chalcogenide Glass Based Inks Obtained by Dissolution Or Nanoparticles Milling," the contents of which are incorporated by reference herein in their entirety.

The substrate 108 may include any solid shape having a surface that can be subjected to printing processes. Examples of suitable substrates include silicon substrates, silicon-oxide coated silicon substrates, and carbon-based substrates. Additional examples may exist. In some embodiments, the substrate 108 may include a substrate having a silicon sublayer and a silicon-oxide layer deposited on the silicon sublayer as described further herein. In some embodiments, the substrate 108 may be a portion of an optical fiber as described further herein.

The printing subprocess 110 may include an inkjet printing process, an aerosol jet printing method. As used herein, the printing process may also refer to a dip-coating process. The printing subprocess 110 may include other types of additive manufacturing or printing processes.

As a result of the printing subprocess 110, a chalcogenide glass layer 112 may be formed on the substrate 108. At this stage, the chalcogenide glass layer 112 may still include components of the chalcogenide glass nanoparticle ink 102, such as the fluid medium 106. In this state, the chalcogenide glass layer 112 may be considered as wet.

The process 100 may include applying a sintering subprocess 114 to the chalcogenide glass layer 112. The sintering subprocess 114 may include heating the chalcogenide glass layer 112 to a first temperature 116 for a first duration 118. This may substantially remove the fluid medium 106 from the chalcogenide glass layer 112. The first temperature 116 and the first duration 118 may be selected to remove enough of the fluid medium 106 to prevent cracking or deformity of the chalcogenide glass layer 112 during annealing. The first temperature 116 and the first duration 118 may also depend on factors such as, a composition of the chalcogenide glass nanoparticle ink 102, a thickness and a shape of the chalcogenide glass layer 112, a thickness and a shape of the substrate 108, or other factors. In some cases, when the chalcogenide glass layer 112 is thinner, or otherwise able to dry (e.g., eliminate the fluid medium 106) more quickly, the first temperature may be 80° C. and the first duration may be up to 2 days.

As a result of the sintering subprocess 114, the fluid medium 106 may be removed from the chalcogenide glass layer 112 such that it is no longer an ink. Rather, the chalcogenide glass layer 112 may have the structure of a rough and/or soft conglomeration of chalcogenide glass nanoparticles. At this stage, the chalcogenide glass layer 112 may not have desirable amorphous properties that are beneficial for particular applications, such as some sensing applications.

The process 100 may include applying an annealing subprocess 120 to the chalcogenide glass layer 112. The annealing subprocess 120 may include heating the chalcogenide glass layer 112 to a second temperature 122 for a second duration 124. The second temperature 122 may be higher than the first temperature 116 and the second duration 124 may be lower than the first duration 118. The second temperature 122 and the second duration 124 may, likewise, be selected to sufficiently harden the chalcogenide glass layer 112 without cracking it and without changing a transmission spectrum associated with it. In some applications, the second temperature may be 300° C., and the second duration may be at least 15 minutes. In other applications, when the chalcogenide glass layer 112 can withstand higher temperatures, the second temperature may be 450° C., and the second duration may be at least 15 minutes.

These temperatures may result in the chalcogenide glass layer 112 hardening and becoming amorphous and free from cracks after the annealing subprocess 120. Likewise, a transmission spectrum of the chalcogenide glass layer may be unchanged by the annealing subprocess 120.

In an example, the process 100 may result in a radiation hard temperature sensor that can measure between 377° C. and 527° C. The chalcogenide glass layer 112 may undergo a phase change and become crystalline at a certain temperature threshold. This may change the optical and electrical properties of the chalcogenide glass layer 112. The changes in optical properties and/or the change in electrical performance may be used as a measurement of the temperature. The sintering subprocess 114 and the annealing subprocess 120 may be closely controlled as a slight over or under heating could cause cracks and change the transmission spectra of the glass.

In an example, the amorphous nature of a printed film of chalcogenide glass was confirmed by x-ray diffraction data. A trace of crystalline iron-oxide was found in the thin film, which can be attributed to a milling process of the chalcogenide glass nanoparticle ink 102. However, due to the high concentration of defects in amorphous chalcogenide glasses, such as Ge20Se80, they tend to have a high tolerance for impurities. So, it is expected that the iron oxide would not affect the thin film properties. Further tests show that the compositional variance of the thin film is within ±1% when compared to the composition of bulk glass, from which the chalcogenide glass nanoparticle ink 102 was synthesized.

Scanning electron microscope analyses show that the above example, the chalcogenide glass layer 112, when un-sintered and unannealed includes separated particles. These particles may give rise to surface roughness and may scatter any light incident upon it. The temperatures 116, 122 and the durations 118, 124 were determined based at least partially on consideration of the ink components. Atomic force microscopy images were taken to determine a surface morphology, which shows that a roughness of the chalcogenide glass layer 112 is reduced by sintering and annealing.

Application of these devices could be for radiation sensors which can measure the radiation dose based on Ag diffusion into the chalcogenide film due to irradiation and which can be reversed by applying a negative voltage on the Ag electrode. This application covers all types of devices for example programmable metallization cell devices (PMC or CBRAM) based on Ag diffusion into the chalcogenide glass. Another application of these devices could be for temperature sensing by which their conductivity or optical properties drastically change by reaching the crystallization temperature for each material and which could be reversed to their initial condition by a short pulse of 5 V at room temperature. This application covers all types of devices whose performance relies on phase change between amorphous and crystalline state of the chalcogenide material, for example, phase change non-volatile memory based on phase change (PCM) devices.

Figure 2:
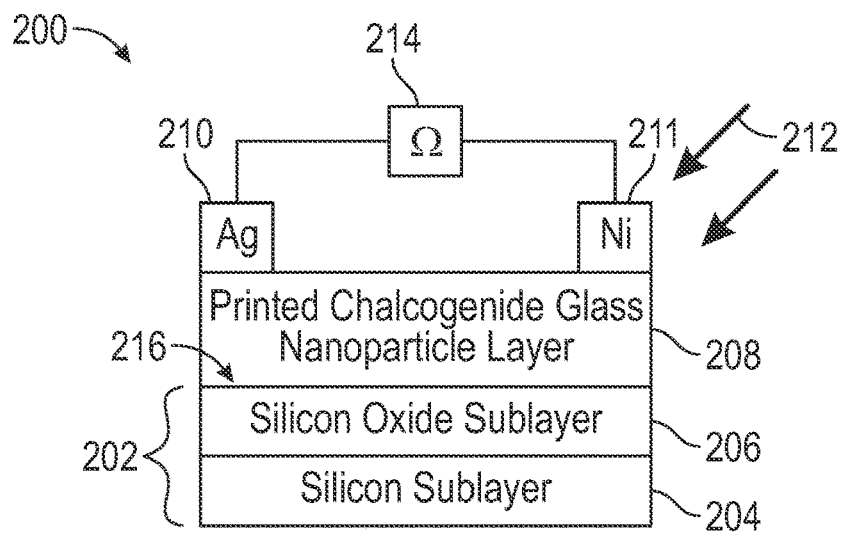
FIG. 2 is a block diagram depicting an embodiment of a radiation sensor device.

Referring to FIG. 2, an embodiment of a radiation sensor device 200 is depicted. The device 200 may include a substrate 202, which may correspond to the substrate 108. The substrate 202 may include a silicon sublayer 204 and a silicon oxide sublayer 206 formed on the silicon sublayer 204. A printed chalcogenide glass nanoparticle layer 208 may be formed on a surface 216 of the substrate 202. The printed chalcogenide glass nanoparticle layer 208 may correspond to the chalcogenide glass layer 112.

A silver layer 210 and a nickel layer 211 may be positioned on the printed chalcogenide glass nanoparticle layer 208. In some embodiments, the silver layer 210 may include silver dots and the nickel layer 211 may include nickel dots applied to the printed chalcogenide glass nanoparticle layer 208 after it has been sintered and annealed.

During operation, radiation 212 may be applied to the device 200. The radiation 212 may cause silver atoms from the silver layer 210 to diffuse into the printed chalcogenide glass nanoparticle layer 208. By diffusing into the printed chalcogenide glass layer 208, the silver may change one or more electrical properties of the printed chalcogenide glass layer 208. For example, an electrical resistance 214 of the chalcogenide glass layer may be altered. As shown in FIG. 2, the silver layer 210 and the nickel layer 211 may function as electrodes for measuring the electrical resistance 214. Other configurations are also possible.

Figure 3:
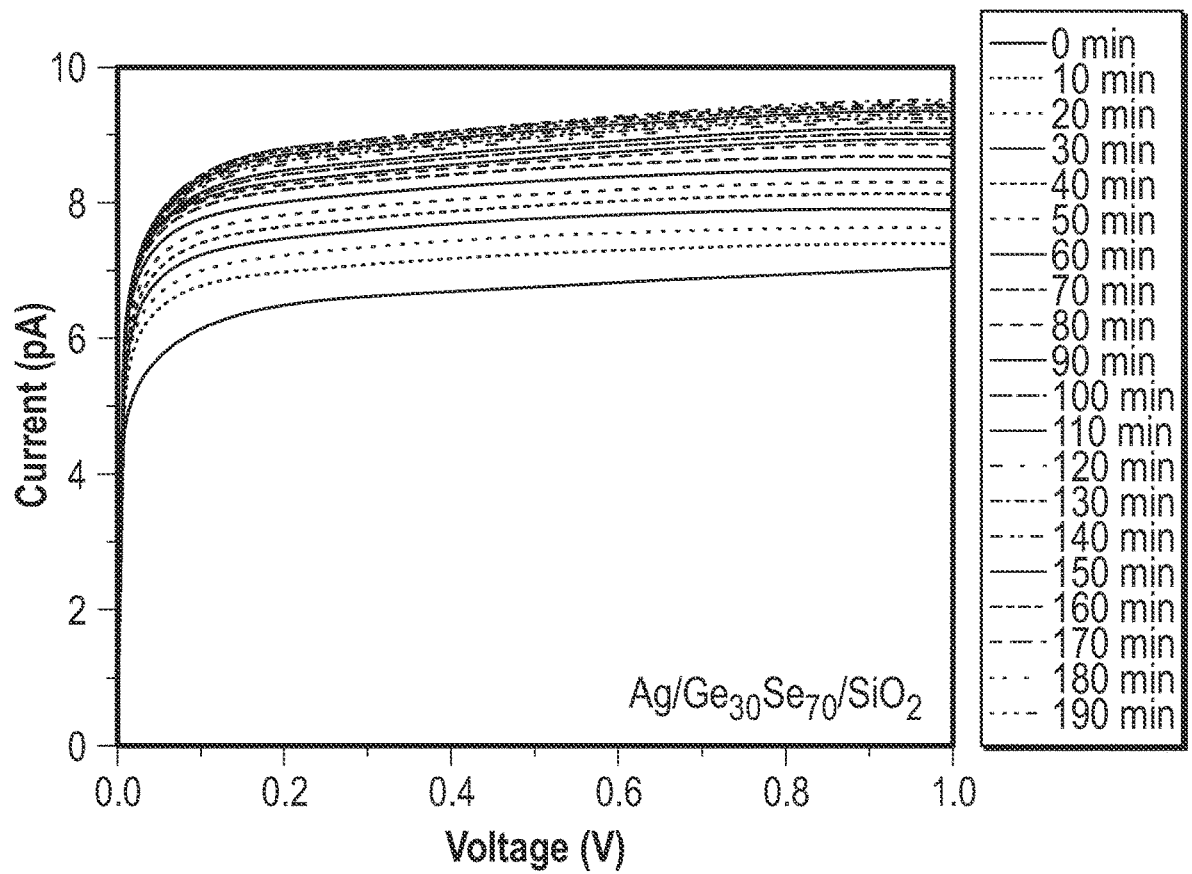
FIG. 3 is a graph depicting a current-voltage (I-V) characterization of an embodiment of a radiation sensor device.

A benefit of the device 200 is that a level of exposure to the radiation 212 may be measured. For example, referring to FIG. 3, a current-voltage (I-V) characterization of an embodiment of a radiation sensor device is depicted. The graph shows a current applied to a Ge30Se70 chalcogenide glass layer having silver deposited thereon as a function of voltage for radiation exposure doses ranging from zero minutes to 190 minutes. For the same voltages, the exposure doses increase the amount of current passing through the chalcogenide glass layer. In other words, exposure to radiation decreases an electrical resistance of the chalcogenide glass layer. Thus, the device 200 may be effective in determining an exposure dose to radiation by measuring an electrical resistance of the printed chalcogenide glass nanoparticle layer 208.

Further, at room temperature, the process of diffusing silver into the chalcogenide glass layer may be reversed by applying a negative voltage on the silver layer 210. This electric field may draw diffused silver ions out of the chalcogenide glass layer 208 and back into the silver layer 210. This may enable the radiation sensor device 200 to be reused multiple times.

Figure 4:
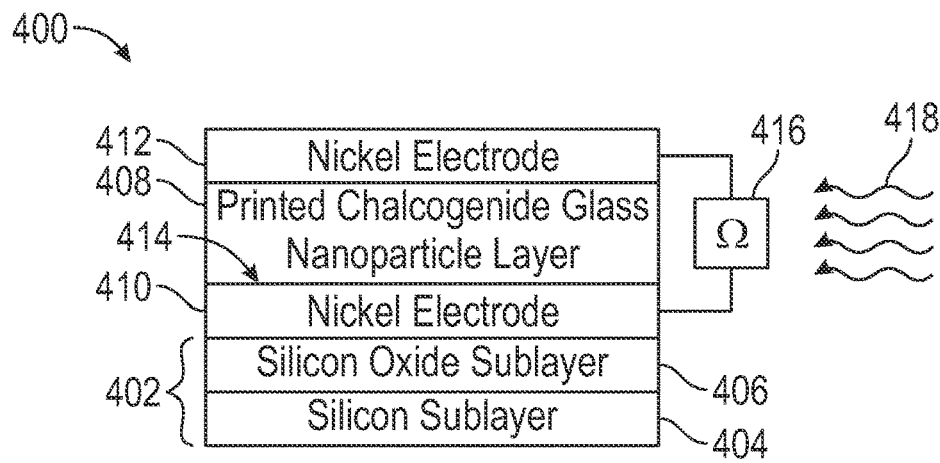
FIG. 4 is a block diagram depicting an embodiment of a temperature sensor.

Referring to FIG. 4, an embodiment of a temperature sensor device 400 is depicted. The device 400 may include a substrate 402, which may correspond to the substrate 108. The substrate 402 may include a silicon sublayer 404 and a silicon oxide sublayer 406 formed on the silicon sublayer 404. A first nickel electrode 410 may be positioned on the substrate 402. A printed chalcogenide glass nanoparticle layer 408 may be formed on a surface 414 of the nickel electrode 410. The printed chalcogenide glass nanoparticle layer 408 may correspond to the chalcogenide glass layer 112. A second nickel electrode 412 may be positioned on the printed chalcogenide glass nanoparticle layer 408.

During operation, heat 418 that is above a threshold temperature may cause the printed chalcogenide glass nanoparticle layer 408 to crystalize. Crystallization of the chalcogenide glass layer may change an electrical resistance 416 of the printed chalcogenide glass nanoparticle layer 408. Thus, by measuring the electrical resistance 416, it may be determined whether the device 400 has been subjected to the threshold temperature.

Figure 5:
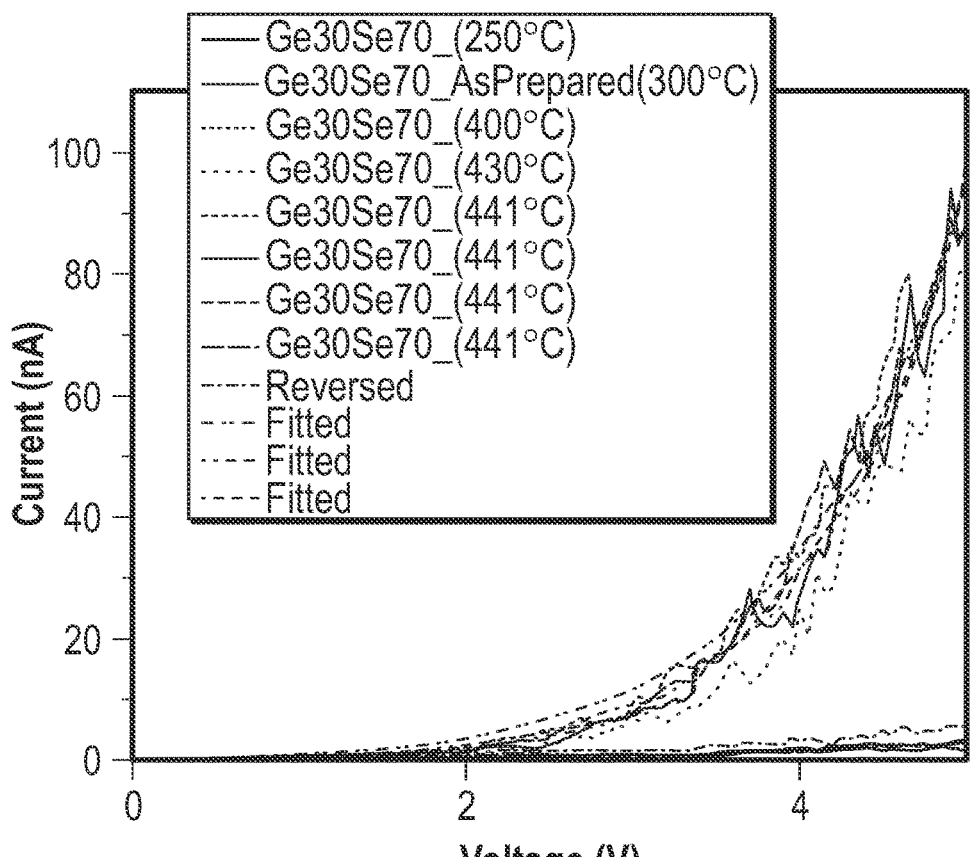
FIG. 5 is a graph depicting an I-V characterization of an embodiment of a temperature sensor.

Referring to FIG. 5, an I-V characterization of an embodiment of a temperature sensor is depicted. The graph shows a current applied to a Ge30Se70 chalcogenide glass layer as a function of voltage for temperatures ranging from 250° C. to 441° C. As shown in the graph, crystallized Ge30Se70 at higher temperatures has a lower electrical resistance response than uncrystallized Ge30Se70. Different compositions of chalcogenide glass may have different temperature responses. Thus, an array of devices corresponding to the device 400 may be capable of measuring temperature increase in real time by measuring the electrical resistance 416 of each device 400 in the array to determine whether it has crystallized or not. FIG. 5 also implies that reversibility of the device is possible. For example, the process may be reversed at room temperature by applying a 5V voltage pulse, which heats by Joule heating the chalcogenide material, which may then be fast cooled (quenched) by the substrate which is at room temperature. As depicted in the graph, there are several curves obtained at 441° C. at several reversing cycles of the device.

Figure 6:
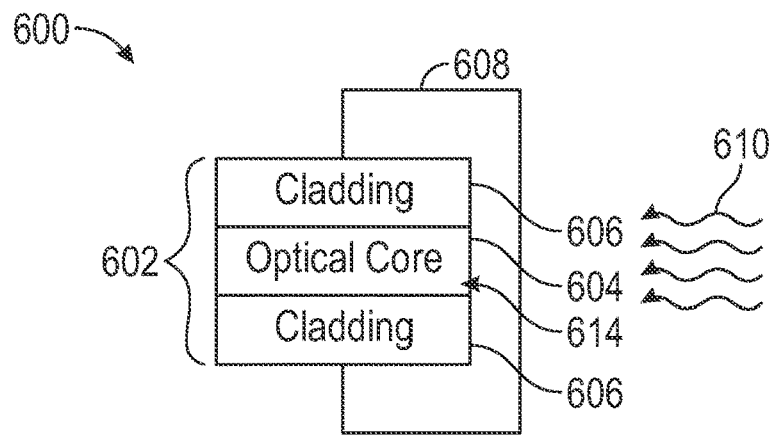
FIG. 6 is block diagram depicting an embodiment of a temperature sensor.

Referring to FIG. 6, an embodiment of a temperature sensor device 600 is depicted. The device 600 may include an optical fiber 602. The optical fiber 602 may correspond to the substrate 108. The optical fiber 602 may include an optical core 604 and a cladding 606 surrounding the optical core 604. A chalcogenide glass nanoparticle layer 608 may be formed on a surface 614 of the optical fiber 602. In this case, the optical fiber 602 may be dip coated with a chalcogenide glass ink. As used herein, the term "printing" is applied broadly to include dip coating.

During operation, heat 610 above a threshold temperature may cause the chalcogenide glass nanoparticle layer 608 to begin to crystalize. An optical reflection parameter of chalcogenide glass layer may change as a function of an amount of crystallization that has taken place within the chalcogenide glass layer 608.

Figure 7:
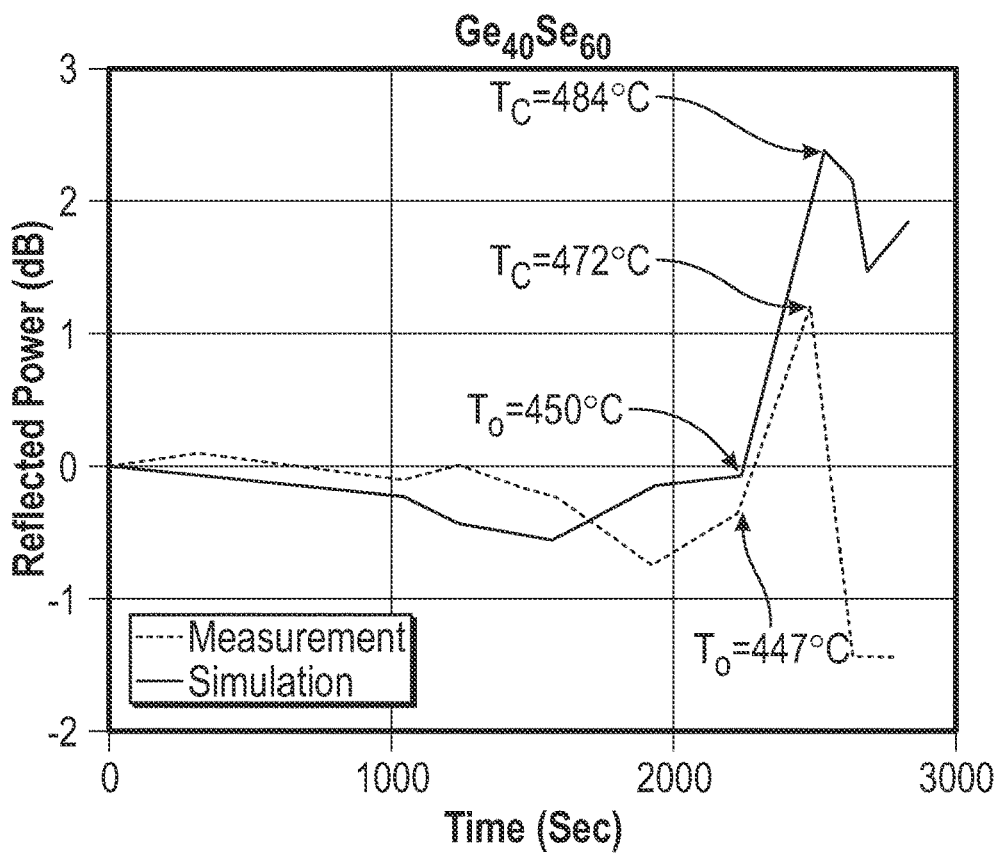
FIG. 7 is a graph depicting a reflected power response of an embodiment of a temperature sensor.

In both the embodiments of FIGS. 6 and 7, an initial amorphous condition of the chalcogenide glass layers can be achieved by applying a 5V voltage at room temperature by which the chalcogenide material melts by Joule heating and undergoes fast cooling (quenching) by the substrate.

Referring to FIG. 7, a graph depicts a reflected power response as a function of time, where a temperature applied to a Ge40Se60 chalcogenide glass is increased over time. of an embodiment of a temperature sensor. As shown in the graph, the Ge40Se60 may begin to crystallize at 447° C. and a crystallization peak may be found at 472° C. By measuring a reflected power of the chalcogenide glass, a determination of temperature between those two limits may be made. Simulated and experimental data may follow a similar trend which verifies the operation of such a temperature sensor.

As described with reference to FIG. 5, the graph of FIG. 7 also implies that the process is reversible. Reversibility may be achieved at room temperature by application of a 5V pulse which heats the chalcogenide glass material by Joule heating. It is subsequently quenching by the substrate, which leads to reversing the material in its initial amorphous condition.

Figure 8:
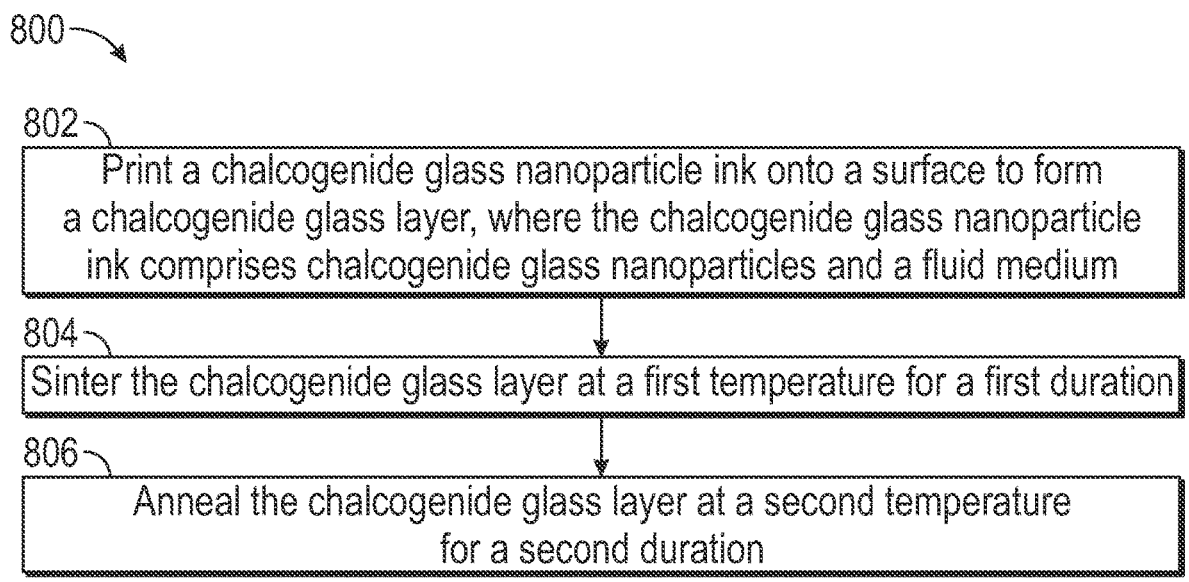
FIG. 8 is a flow chart depicting an embodiment of a sensor formation method.

Referring to FIG. 8, an embodiment of a sensor formation method 800 is depicted. The method 800 may include printing a chalcogenide glass nanoparticle ink onto a surface to form a chalcogenide glass layer, where the chalcogenide glass nanoparticle ink comprises chalcogenide glass nanoparticles and a fluid medium, at 802. For example, the chalcogenide glass layer 112 may be printed on the substrate 108. The surface may be, for example, the surface 216 of the substrate 202, the surface 414 of the first nickel electrode 410, or the surface 614 of the optical fiber 602.

The method may further include sintering the chalcogenide glass layer at a first temperature for a first duration, at 804. For example, the chalcogenide glass layer 112 may be sintered for at the first temperature 116 for the first duration 118.

The method may also include annealing the chalcogenide glass layer at a second temperature for a second duration, at 806. For example, the chalcogenide glass layer 112 may be annealed for at the second temperature 122 for the second duration 124.

A benefit of the method 800 may be that a chalcogenide glass layer may be formed at a lower cost than typical vapor deposition techniques without cracking the chalcogenide glass layer and without changing a transmission spectrum of the chalcogenide glass layer relative to bulk chalcogenide glass material. Other advantages may exist.

Although various embodiments have been shown and described, the present disclosure is not so limited and will be understood to include all such modifications and variations as would be apparent to one skilled in the art.

What is claimed is:

1. A device comprising:
   a substrate;
   a printed chalcogenide glass layer on the substrate, wherein the printed chalcogenide glass layer includes annealed chalcogenide glass, and wherein the printed chalcogenide glass layer is free from cracks; and
   a silver layer positioned on the printed chalcogenide glass layer, wherein a presence of radiation causes at least a portion of the silver layer to diffuse into the printed chalcogenide glass layer, and wherein the silver layer diffusing into the printed chalcogenide glass layer changes an electrical resistance of the printed chalcogenide glass layer.

2. The device of claim 1, wherein the printed chalcogenide glass layer is transformed from a crystalized condition to an amorphous condition by application of a voltage to melt the printed chalcogenide glass layer followed by quenching as a result of the substrate being at room temperature.

3. The device of claim 1, wherein the substrate comprises a silicon sublayer and a silicon oxide sublayer.

4. The device of claim 1, further comprising a nickel layer positioned on the printed chalcogenide glass layer.

5. The device of claim 4, wherein the silver layer includes silver dots and the nickel layer includes nickel dots.

6. The device of claim 1, wherein the printed chalcogenide glass layer includes $Ge_{20}Se_{80}$ or $Ge_{20}S_{80}$.

7. A device comprising:
   a substrate;
   a printed chalcogenide glass layer on the substrate, wherein the printed chalcogenide glass layer includes annealed chalcogenide glass, and wherein the printed chalcogenide glass layer is free from cracks;
   a first nickel electrode formed on the substrate and separating the substrate from the printed chalcogenide glass layer; and
   a second nickel electrode formed on the printed chalcogenide glass layer, wherein a presence of heat above a threshold temperature causes the printed chalcogenide glass layer to crystalize, and wherein crystallization of the printed chalcogenide glass layer changes an electrical resistance of the printed chalcogenide glass layer.

8. The device of claim 7, wherein the substrate comprises a silicon sublayer and a silicon oxide sublayer.

9. The device of claim 7, wherein the printed chalcogenide glass layer is transformed from a crystalized condition to an amorphous condition by application of a voltage to melt the printed chalcogenide glass layer followed by quenching as a result of the substrate being at room temperature.

10. A device comprising:
a substrate, wherein the substrate is a portion of an optical fiber; and
a printed chalcogenide glass layer on the substrate, wherein the printed chalcogenide glass layer includes annealed chalcogenide glass, and wherein the printed chalcogenide glass layer is free from cracks, wherein a presence of heat above a threshold temperature causes the printed chalcogenide glass layer to begin to crystalize, and wherein an optical reflection parameter of printed chalcogenide glass layer changes as a function of an amount of crystallization within the printed chalcogenide glass layer.

11. The device of claim 10, wherein the optical fiber includes an optical core and cladding surrounding the optical core, wherein the chalcogenide glass is in contact with an output facet of the optical core.

12. The device of claim 11, wherein the chalcogenide glass coats a portion of an outer surface of the cladding.

13. The device of claim 10, wherein the printed chalcogenide glass layer is transformed from a crystalized condition to an amorphous condition by application of a voltage to melt the printed chalcogenide glass layer followed by quenching as a result of the substrate being at room temperature.

* * * * *